United States Patent [19]
Tanaka et al.

[11] Patent Number: 6,093,511
[45] Date of Patent: Jul. 25, 2000

[54] METHOD OF MANUFACTURING SEMICONDUCTOR DEVICE

[75] Inventors: Hiroyuki Tanaka; Kenji Nakagawa, both of Kawasaki, Japan

[73] Assignee: Fujitsu Limited, Kawasaki, Japan

[21] Appl. No.: 08/944,515

[22] Filed: Oct. 6, 1997

Related U.S. Application Data

[63] Continuation of application No. 08/471,517, Jun. 6, 1995, abandoned.

[30] Foreign Application Priority Data

Jun. 30, 1994 [JP] Japan ..................................... 6-150130

[51] Int. Cl.$^7$ .................................................. H01L 2/308
[52] U.S. Cl. .............................. 430/30; 430/311; 430/22; 250/491.1; 356/401
[58] Field of Search .................................. 430/5, 22, 30, 430/394, 396; 250/491.1; 356/399, 401

[56] References Cited

U.S. PATENT DOCUMENTS

| | | | |
|---|---|---|---|
| 3,742,229 | 6/1973 | Smith et al. | 430/22 |
| 4,669,866 | 6/1987 | Phillips | 356/401 |
| 4,794,648 | 12/1988 | Ayata et al. | 356/401 |

FOREIGN PATENT DOCUMENTS

| | | | |
|---|---|---|---|
| 279555 | 6/1990 | Germany | 430/22 |
| 57-192029 | 11/1982 | Japan | 430/22 |
| 59-94418 | 5/1984 | Japan | 430/22 |
| 59-101829 | 6/1984 | Japan | 430/22 |
| 59-231542 | 12/1984 | Japan | 430/5 |
| 62-115830 | 5/1987 | Japan | 430/30 |
| 63-250119 | 10/1988 | Japan | 365/401 |
| 1-59231 | 3/1989 | Japan | 430/22 |
| 1-262549 | 10/1989 | Japan | 430/5 |
| 2-3043 | 1/1990 | Japan . | |
| 3-167817 | 7/1991 | Japan | 430/394 |
| 3-269433 | 12/1991 | Japan | 430/5 |
| 5-142745 | 6/1993 | Japan | 430/5 |
| 6-20923 | 1/1994 | Japan | 430/30 |
| 6-3657 | 1/1994 | Japan . | |

*Primary Examiner*—Martin Angebranndt
*Attorney, Agent, or Firm*—Nikaido, Marmelstein, Murray & Oram LLP

[57] ABSTRACT

The present invention relates to a method of manufacturing a semiconductor device including a step of exposing a resist by use of an exposure mask. An object of the present invention is to facilitate a level adjustment of the reticle and thus automatically determine an optimum focus. The present invention has steps of providing a reticle with a plurality of inspection patterns, which are positioned within a dicing line area around a semiconductor integrated circuit forming area on the reticle, and of which each has a size such that their transferred patterns are changed in shape according to an amount of deviation in focus, and exposing a resist by use of the reticle.

19 Claims, 14 Drawing Sheets

METHOD OF MANUFACTURING SEMICONDUCTOR DEVICE

This a application is a continuation of application Ser. No. 08/471,517 filed Jun. 6, 1995 now abandoned.

BACKGROUND OF THE INVENTION

1. Field of the Invention

The present invention relates to a method of manufacturing semiconductor devices and, more particularly, a method of manufacturing semiconductor devices including a step of exposing a resist by use of an exposure mask.

2. Description of the Prior Art

A film patterning step in terms of photolithography technique has been essentially required in order to manufacture semiconductor integrated circuits (LSIs). In a photolithography technique, the fine pattern of the LSIs obtained by a reduction-type projection printing method has been employed to enable fine patterning of the LSIs. In order to improve resolution in exposure process, an exposure light having a short wavelength such as i beam (365 nm) etc. and a projection lens system having a large numerical aperture (NA) have been adopted.

In the exposure process, by use of a reticle, as shown in FIG. 1A, having thereon an LSI pattern area 101 and a dicing line area 102 around the LSI pattern area 101, a plurality of LSI patterns 104 are exposed on a wafer 103 shown in FIG. 1B.

A depth of focus of the exposure apparatus can be made small by increasing the numerical aperture and shortening the wavelength of the exposure light. Therefore, an image point of the exposure light must be adjusted with high accuracy to a surface of a resist, as a material to be exposed, formed on the wafer 103.

An image plane of the stepper must be adjusted to be in focus over an entire area of the LSI circuit pattern (referred to also as an exposure area hereinafter). Such operations for a location adjustment is called as a level adjustment. The level adjustment must be effected before the first exposure process of the LSI pattern. In general, once the level adjustment has been done, it is not adjusted repeatedly in succeeding exposure processes.

The level adjustment is effected based on the following procedures (1) to (4).

(1) By changing an amount of slant of a stage on which the wafer is positioned, a plurality of LSI patterns having their different slant amounts are exposed on the resist formed on the wafer. Since image points of the LSI patterns are differentiated from each other by changing their slant amounts, both a just-focused exposure state and a defocused exposure state can be caused.

(2) After developing the resist, pattern shapes formed in the four corners of each exposure area are checked to detect an amount of change in focus. Thereby, an optimum focus value is determined.

(3) Based on optimum focus values on plural points, a relative amount of slant of the surface of the wafer can be determined.

(4) The amount of slant of the stage can be adjusted by inputting the determined relative amount of slant into the exposure apparatus. Thus, the exposure apparatus is set to an ordinary state capable of exposing.

However, suppose that the exposure apparatus is used for a long time after the above level adjustment is completed, the condition of the stage sometimes changes gradually or suddenly to thus cause the amount of slant of the stage to change. Therefore, after completing the development, it must be determined by judging the pattern shapes in the four corners of the exposure area whether the amount of slant is still proper or not.

But, since the LSI circuit patterns are not always formed as the same patterns in the four corners of the exposure area, it becomes difficult to determine which pattern shape is relatively proper or not. Besides, it is difficult to compare the patterns in the four corners of the exposure area with each other because of their discrete locations. Accordingly, that comparison is to be dependent on measurement. Thus, there is a drawback that the level adjustment operation becomes troublesome so that it takes a lot of time.

In addition, when adjusting the level of the stage, it depends on operator's experiences to judge whether the optimum focus has been obtained or not. Thus, there is a case where, because of the operator's poor experiences, non-optimum amount of slant of the stage is passed up. In such case, when the wafer is subject to the succeeding manufacturing steps, the defect of the LSI can be found at the time of the final LSI circuit test. Thereby, a drawback is caused that a yield of the LSI is lowered.

SUMMARY OF THE INVENTION

It is an object of the present invention to provide a method of manufacturing a semiconductor device including an exposure step wherein a level adjustment can be facilitated and thus an optimum focus of an exposure light can be determined automatically upon adjusting a level of the surface of a wafer.

According to the present invention, such a reticle is employed that a plurality of inspection patterns are formed in a dicing line area around a semiconductor integrated circuit forming area, and that the plurality of inspection patterns are formed so as to be varied in shape of their transferred patterns on the resist according to an amount of deviation in focus.

In consequence, in case semiconductor integrated circuit patterns are repeatedly exposed on a resist formed on a wafer by use of one sheet of a reticle (mask), a plurality of inspection patterns are transferred a plurality of times in dicing line areas on the wafer at a distance every time when exposure steps are repeated. Therefore, by comparing shapes and sizes of the plurality of the inspection patterns on the dicing lines, the deviation in focus can be recognized visually. As a result, it can be determined easily whether an amount of slant of the wafer is out of an allowable range or not, so that a level adjustment can be facilitated. In addition, when comparing the shapes and the sizes of the plurality of the inspection patterns, it can be determined easily and automatically whether or not an optimum focus has been attained.

The inspection patterns of the reticle are disposed not to be overlapped when they are transferred a plurality of times in the dicing line areas on the wafer, preferably, in intersecting areas of the dicing line areas or their neighbor areas on the wafer by step and repeat. Thus, a plurality of the inspection patterns can be compared at a look even within a narrow field of view of a microscope.

A plurality of the inspection patterns are disposed so that their patterns transferred in the intersection areas of the dicing line areas have the same configurations as those of the inspection patterns of the reticle. Thereby, a correspondence between the wafer and the reticle can be obtained readily, and further the direction of deviation in focus can easily be found.

The plural inspection patterns formed on the wafer are disposed in a matrix fashion or in parallel, so that they can be readily compared with each other.

In the meanwhile, by providing following features to the inspection patterns of the reticle, it can be decided without difficulty whether there exists a deviation in focus on the wafer or not.

Firstly, each of the inspection patterns of the reticle is formed as a rhombus. Thus, an amount of change in transferred shape on the wafer can be easily judged.

Secondly, the inspection patterns of the reticle are formed so as to have the same shapes as those of patterns to be formed on said semiconductor integrated circuit forming area. With this, a change in shapes of the semiconductor integrated circuit can also be readily estimated.

Thirdly, masking patterns made of a light shielding material are formed around said inspection patterns on said reticle. Thus, it can be prevented that the inspection patterns already exposed on the resist on the wafer are repeatedly exposed, or otherwise inspection pattern areas to be exposed next are accidentally exposed.

Fourthly, the inspection patterns of the reticle are formed at different locations on every reticle. With this, the deviation in focus between reticles can be easily found, so that a sudden increase in the amount of slant of the wafer can be simply recognized.

Fifthly, a plurality of subsidiary patterns, which enable an amount of change in shape of the inspection patterns to be read on the basis of locations of the subsidiary patterns, are formed near the inspection patterns of the reticle. For this reason, the change in shape of the inspection patterns can be readily recognized.

Sixthly, a plurality of identification patterns capable of identifying locations of the inspection patterns of the reticle are formed near the inspection patterns of the reticle. Thereby, a correspondence between the inspection patterns on the reticle and the inspection patterns on the wafer can be easily obtained.

Seventhly, the inspection patterns of the reticle are composed of a combination of a plurality of patterns formed spaced apart each other. Thus, the deviation in focus of the exposure light can be judged according to coupling states of the inspection patterns.

In addition to the reticles described in advance, the reticle is also called as a "mask" according to their slight differences in function between them. However, in the present invention, it should be noted that the mask is included in a term of the reticle. The same advantages as those obtained by the reticle can be derived from such masks, each having the same configuration as that of the reticle.

DETAILED DESCRIPTION OF THE PREFERRED EMBODIMENTS

Preferred embodiments of the present invention will now be described hereinafter with reference to the accompanying drawings.

Figure 1A:
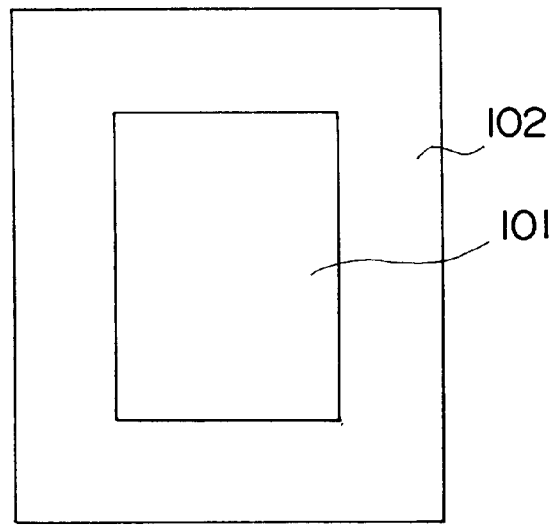
FIG. 1A is a plan view showing a conventional reticle.
Figure 1B:
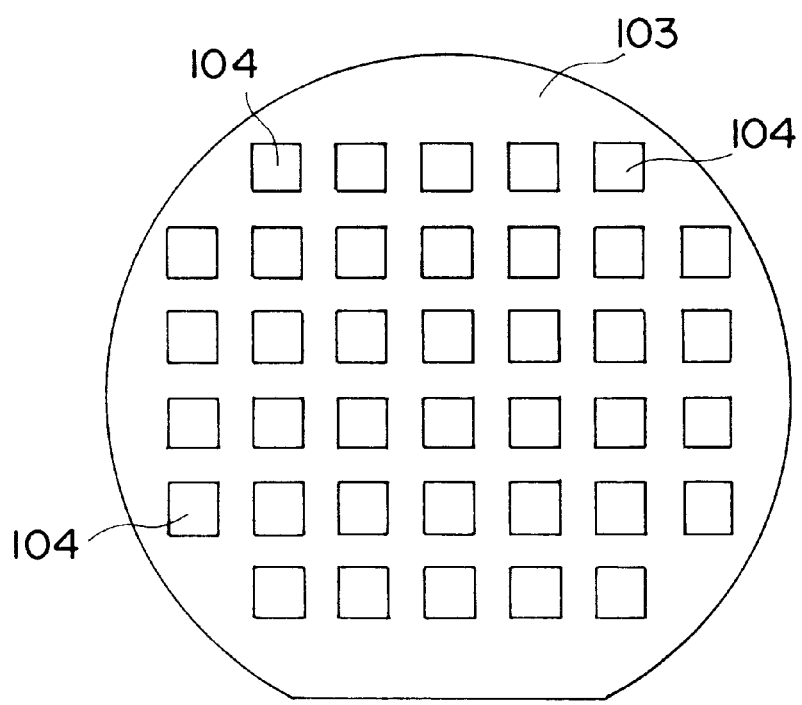
FIG. 1B is a plan view showing a situation obtained after a resist is exposed by use of the conventional reticle in FIG. 1A and developed.
Figure 2:
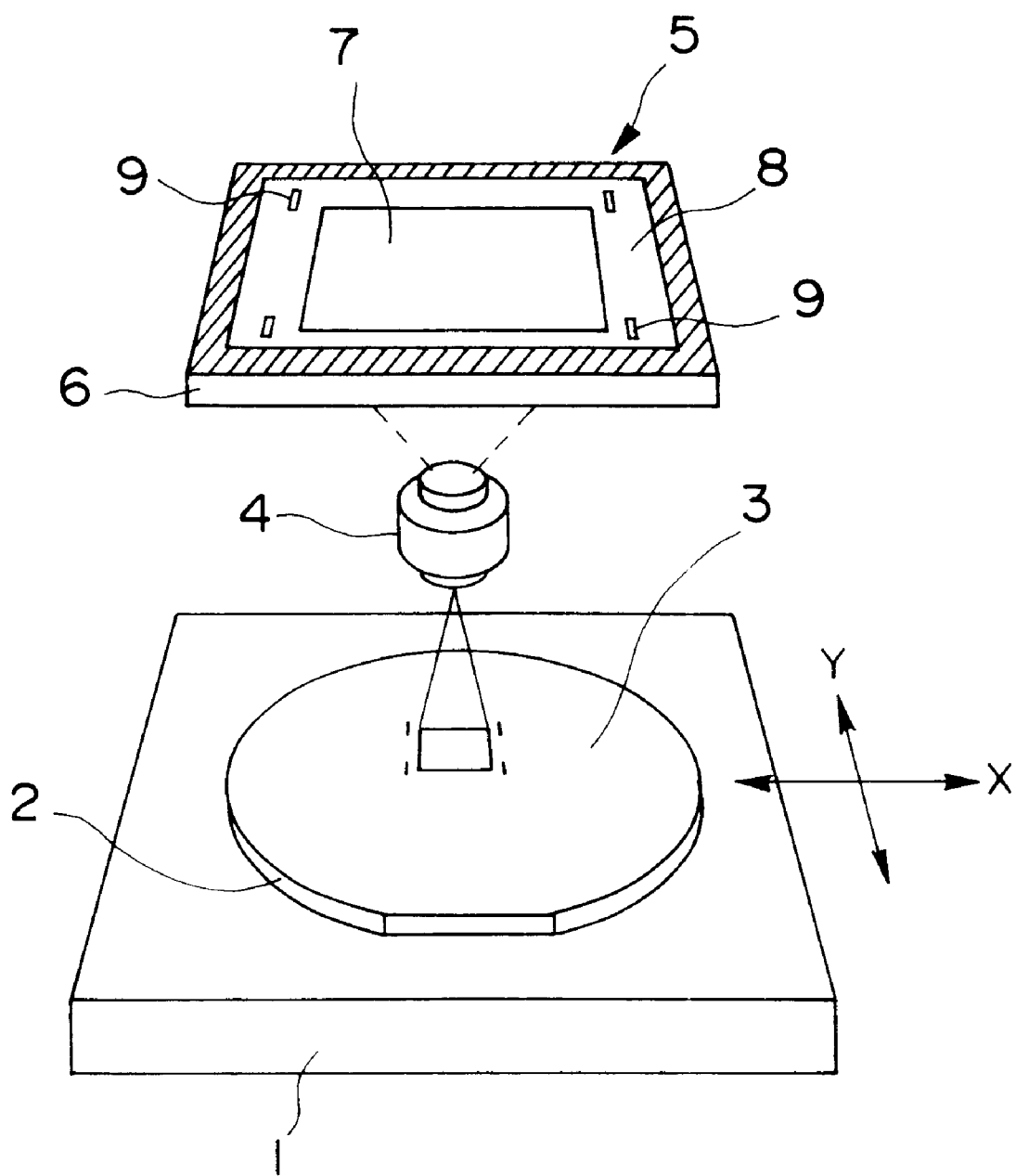
FIG. 2 is a perspective view showing an exposure process according to the present invention.
Figure 3A:
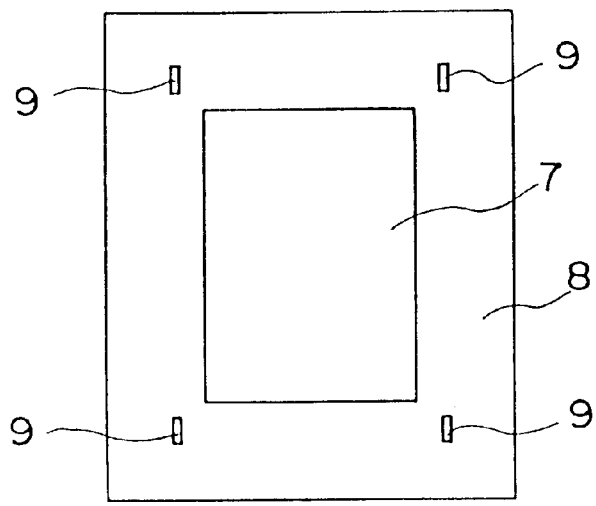
FIG. 3A is a plan view showing a reticle employed in the embodiment of the present invention.

FIG. 2 is a perspective view illustrating an exposure process according to the present invention. FIGS. 3A and 3B are plan views respectively showing principle pattern configurations of a reticle and those patterns transferred on a resist on a wafer according to the embodiment of the present invention.

In FIG. 2, a wafer 2 made of a silicon or a gallium arsenic is positioned on a stage 1 which can be moved stepwise in X and Y directions. A resist 3 is applied to the wafer 2. A reticle (also called as an exposure mask according to its functional difference) 5 is positioned right over the resist 3 via an optical system 4.

As shown in FIGS. 2 and 3A, the reticle 5 has an LSI pattern area 7 and a dicing line area around the LSI pattern area 7, both formed on a transparent substrate 6. Inspection patterns 9 used for testing a focus state of the reticle 5 are formed in the dicing line area 8. The inspection patterns 9 are formed on the reticle 5 so as to have the same shapes. Therefore, when the inspection patterns 9 are transferred on the resist 3, the shapes of the inspection patterns 9 are varied depending upon a deviation in focus and their sizes. Transferring locations of the inspection patterns 9 are not especially limited. However, it is preferable that, if taking account of easiness of inspection, the inspection patterns 9 should be formed in the areas near four corners of the LSI pattern area 7.

In case a positive type resist is applied to the wafer 2, the exposure light transmits through the dicing line area 8. As a result, the inspection patterns 9 in the dicing line area 8 has to be formed of a light shielding material. On the contrary, in case a negative type resist 3 is applied to the wafer 2, the inspection patterns 9 has to exist as opening areas in a film made of a light shielding material over the dicing line area 8.

The transparent substrate is made of, for example, quartz. The light shielding film is made of, for example, chromium.

In case, when using the above exposure apparatus, semiconductor integrated circuit patterns are repeatedly exposed on the resist 3 formed on the wafer 2 by use of one sheet of the reticle (mask) 5, and the exposure process is repeated while moving stepwise the stage 1.

Figure 3C:
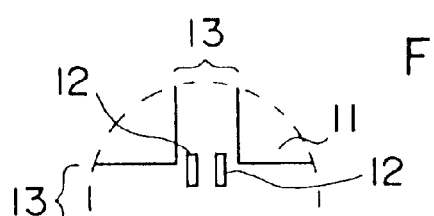
FIG. 3C is a detailed view of a portion of FIG. 3B.
Figure 3B:
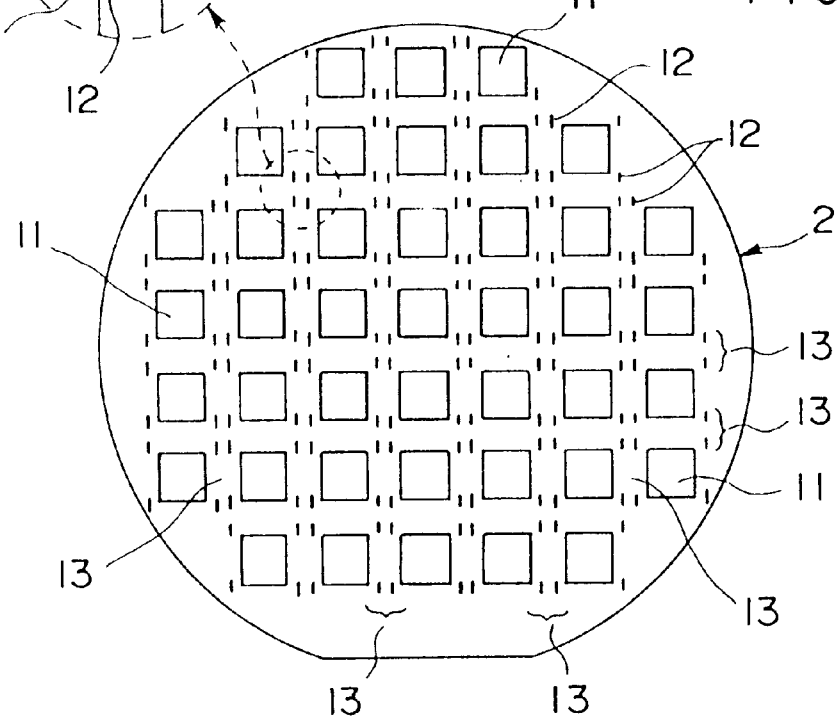
FIG. 3B is a plan view showing a situation obtained after a resist on a wafer is exposed by use of the reticle in FIG. 3A and developed.

After that, when the resist 3 is developed after completing the above exposure process, a plurality of LSI patterns 11 are formed on the resist 3, as exemplified in FIG. 3B and FIG. 3C. The LSI patterns 11 of the resist 3 is formed by reduce-transferring the LSI pattern 7 of the reticle 5.

Succeedingly, a film (not shown) on the wafer 2 is patterned by using the LSI pattern 11 and the inspection patterns 12 therearound as an etching resistant mask. The film is made of any one of a conductor, a semiconductor and an insulator.

In the meanwhile, in the present invention, as shown in FIG. 3A, inspection patterns 9 each having the same shape are formed near the four corners of the LSI patterns 7 on the reticle 5. Therefore, in the dicing line areas 13 near the four corners of the LSI patterns 11 of the resist 3, a plurality of inspection patterns 12, which are transferred one after another every time when the exposures are repeated, exist spaced apart from each other. Thus, by comparing shapes and sizes of the plurality of inspection patterns 12 formed in the dicing line areas 13, a deviation in focus can be recognized visually.

As shown in FIG. 3B, the inspection patterns 12 are disposed collectively. The areas wherein the inspection patterns 12 are disposed collectively are not especially restricted within the dicing line areas 13, but it is preferable that they are set within the intersecting areas of the dicing line areas 13 or their neighbor areas.

In consequent, even when the inspection patterns 12 are checked by use of an observation apparatus having a narrow field of view such as an electron microscope, a plurality of inspection patterns 12 formed by multiple exposure processes can be watched objectively and at a glance.

Since four inspection patterns 12 which are disposed in dicing line areas 13 on the wafer, preferably, in intersecting areas of dicing lines 13 or their neighbor areas have the same shape, relative differences in shape of the inspection patterns 12 can be easily judged at a look. Thus, a change in shape of each inspection pattern 12 due to the deviation in focus may be readily detected. This prevents troublesome labors such that differences in length between the inspection patterns 12 had to be detected heretofore by individually measuring the lengths of the plurality of inspection patterns 12. Accordingly, efficiency of the inspection and in turn efficiency of the level adjustment can be extremely improved.

The locations of the inspection patterns 9 on the reticle 5 must be designed such that each of distances between the inspection patterns 12 transferred on the dicing line areas 13 becomes about several tens $\mu$m. If the inspection patterns 9 are located to have such distance mutually, the deviation in focus depending on the amount of slant of the wafer 2 appears as a difference in shape of the inspection patterns 12.

Thus, if some of the four inspection patterns 12 are got out of shape, the slant direction of the wafer 2 can be derived from the location and the direction of such deformed inspection patterns 12. In addition, a amount of slant of the wafer 2 can be derived from the extent of deformed amount of such inspection patterns 12.

Based on the principle described in advance, concrete embodiments of both the inspection patterns of the reticle and the inspection patterns transferred on the resist will be described hereinafter.

(First Embodiment)

Figure 4A:
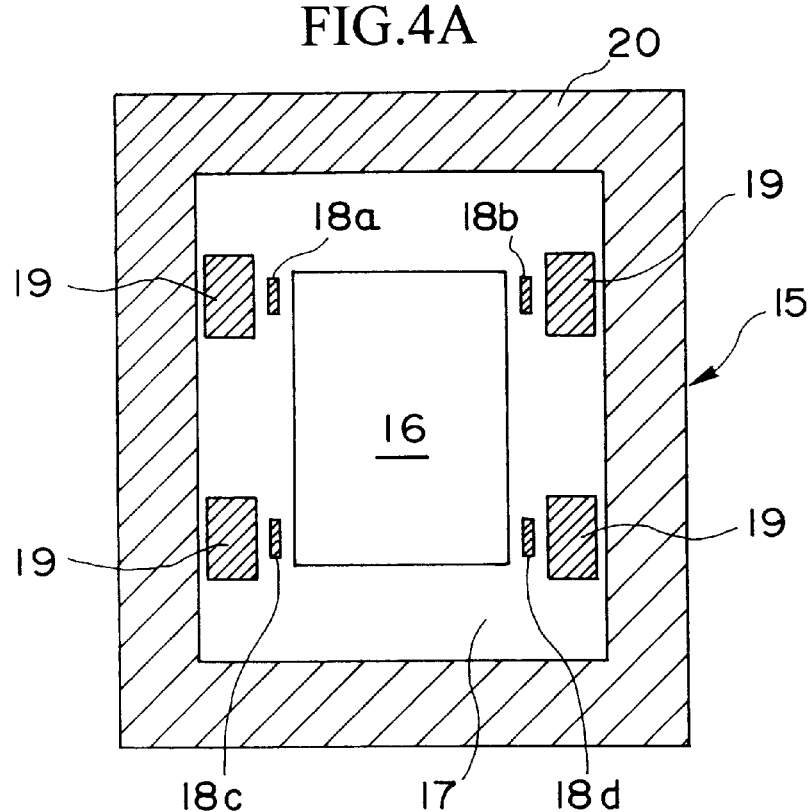
FIG. 4A is a plan view showing the first reticle employed in the present invention.
Figure 4B:
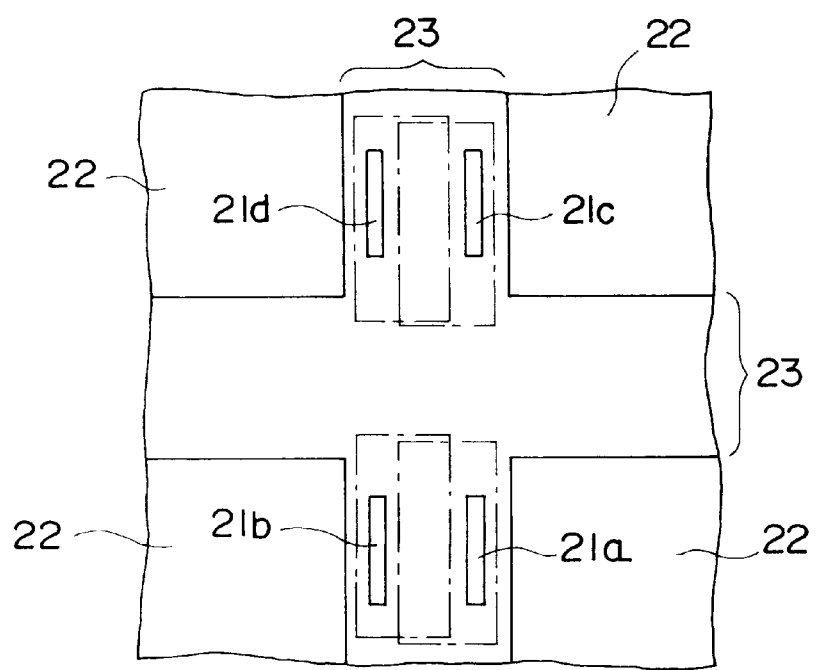
FIG. 4B is an enlarged plan view showing transferred patterns of the first reticle on the resist.

FIG. 4A is a plan view showing the first embodiment of the reticle employed in the present invention. FIG. 4B is an enlarged plan view showing patterns on the resist formed on the wafer by use of the reticle in FIG. 4A.

In the reticle 15 shown in FIG. 4A, four inspection patterns 18a to 18d which are formed in the dicing line areas 17 around the LSI pattern 16 exist in both sides of the LSI pattern 16 and near the four corners of the LSI pattern 16. A size and a shape of each of these inspection patterns 18a to 18d have a dependency on focus. In this embodiment, as shown in FIG. 4B, an inspection pattern 21 is so formed linearly on the resist 3 in a just-focused exposure state (an exposure state having no deviation in focus) to have a width of 0.5 $\mu$m and a length of 10 $\mu$m.

If the resist 3 is exposed repeatedly by use of one sheet of the reticle 15 while moving stepwise the stage 1 in X direction and Y direction, the dicing line areas 17 are exposed overlappingly on the resist 3. Therefore, a masking pattern 19 made of a light shielding film must be formed outside the inspection patterns 18a to 18d. By using this masking pattern 19, either inspection patterns already exposed on the resist 3 can be prevented from being eliminated by the exposure process, or the area where the inspection patterns will be then formed can be prevented from being exposed.

The masking pattern 19 is formed to have a size capable of completely covering other inspection patterns formed in the dicing line areas 17 when the LSI pattern 16 is exposed. For example, the masking pattern 19 is formed as a rectangular shape having a size of 2 $\mu$m×12 $\mu$m.

A frame-like masking pattern 20 is formed around the dicing line areas 17 so as to prevent the exposure light from leaking from the dicing line areas 17 to the outside.

As shown in FIG. 4B, four inspection patterns 21a to 21d are formed near the intersecting areas of the dicing line areas 23 surrounding the LSI pattern 22 when the resist on the wafer is exposed by use of the reticle 15 and then developed. The inspection patterns 21a to 21d are formed on the resist (the same is true in the second embodiment). In FIG. 4B, a dashed line denotes a location which corresponds to the masking pattern 19 in the dicing line area 23.

Differences in shapes of the inspection patterns 21a to 21d can be watched once within the field of view of the microscope. If the inspection patterns 21a to 21d have different shapes and there exists any inspection patterns 21a to 21d having deformed shapes, it can be concluded that a level of the wafer 2 is not adjusted properly since the wafer 2 is inclined.

The direction of slant is determined by setting the LSI pattern 22 as a center, i.e., as a standard point. As shown in FIG. 4B, if some of the inspection patterns 21a to 21d get out of shape, for instance, the direction of slant of the wafer is determined by coinciding them with the location of the inspection patterns 18 of the reticle 15.

It should be noted that four inspection patterns 18a to 18d of the reticle 15 shown in this first embodiment may be not always formed near the corners of the LSI pattern 16. Unless the inspection patterns 18a to 18d are formed near the corners, two inspection patterns on one side of the LSI pattern 16 is formed so that a length between transferred patterns is within the field of view of the microscope.

(Second Embodiment)

In the second embodiment, the inspection pattern areas exist in the diagonal direction of the LSI pattern, which is different from the first embodiment.

Figure 5A:
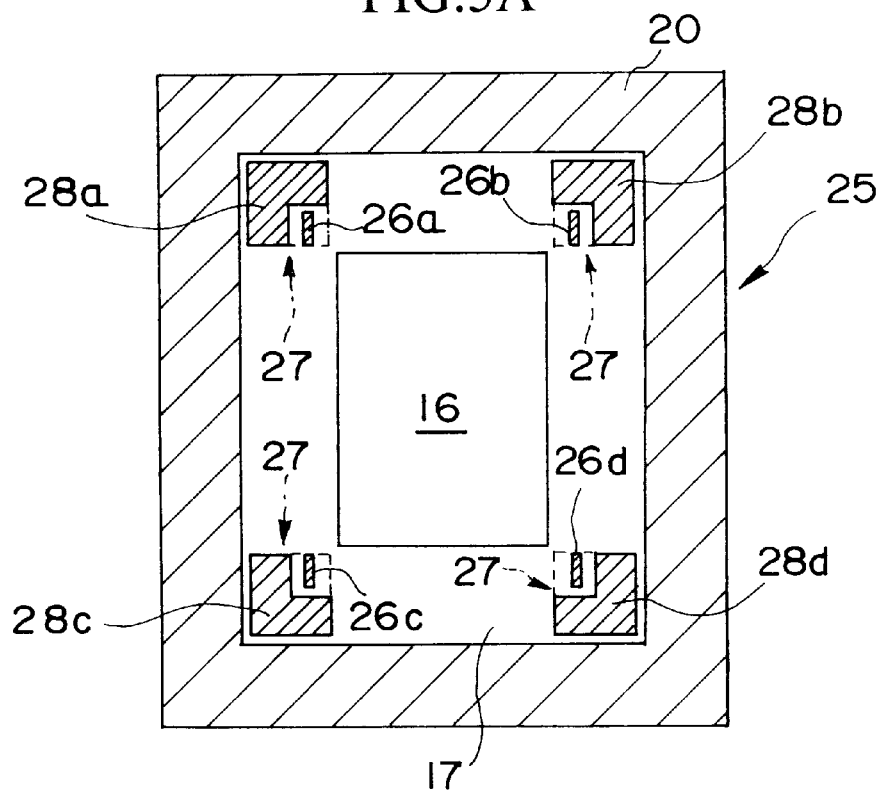
FIG. 5A is a plan view showing the second reticle employed in the present invention.

FIG. 5A shows a plane configuration of the pattern of the reticle 25. Except for inspection patterns 26a to 26d and masking patterns 28a to 28d, the configuration of the second embodiment are the same as these of the first embodiment. The same references as those used in FIG. 4 denote the same elements shown therein.

In FIG. 5A, in the dicing line area 17, inspection pattern forming areas 27 are disposed in the diagonal directions of four corners of a square LSI pattern 16, respectively. These inspection pattern forming areas 27 are divided into four sections in the dicing direction. Inspection patterns 26a to 26d are formed in the portions nearest to the LSI pattern 16. The inspection patterns 26a to 26d have the same shape and, like the first embodiment, their sizes and shapes have a dependency on focus.

Among the inspection pattern forming areas 27 divided into four sections, L-shaped masking patterns 28a to 28d are formed in the inspection pattern forming areas 27 having none of the inspection pattern 26a to 26d.

By use of the masking patterns 28a to 28d, either inspection patterns already exposed on the resist can be prevented from being eliminated by the exposure process, or the area where the inspection patterns will be then formed can be prevented from being exposed.

The inspection pattern forming areas 27 are formed in an narrower area than the width of the dicing line area 17. The forming areas 27 are formed in a square shape having a side of at least 100 μm when they are transferred on the resist.

Figure 5B:
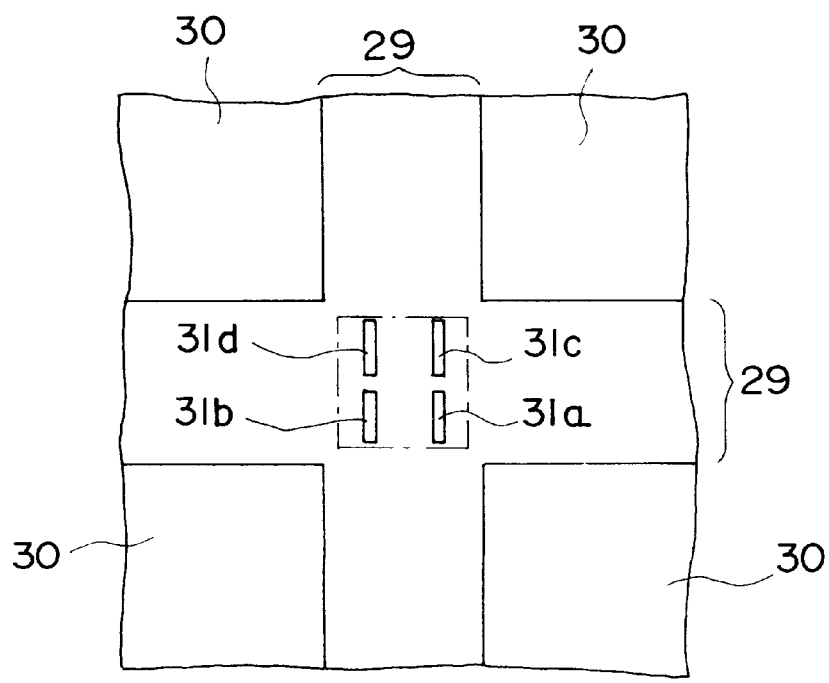
FIG. 5B is an enlarged plan view showing transferred patterns of the second reticle on the resist.

When the resist 3 on the wafer 2 is exposed using such reticle 25 and then developed, the LSI patterns 30 are formed on the resist 3, as shown in FIG. 5B, and four inspection patterns 31a to 31d are formed in the intersecting areas of the dicing line areas 29. A dashed line denotes an area for the masking patterns 28a to 28d in the dicing line area 29.

Four inspection patterns 31a to 31d formed in the intersecting areas of the dicing line areas 29 on the wafer 2 are within the field of view of the microscope, so that their differences can be grasped at once. In case the inspection patterns 31a to 31d have differences in shape, it can be concluded that a level adjustment is not properly completed since the wafer is inclined.

(Third Embodiment)

In the third embodiment of the reticle, the inspection patterns are formed as light transmitting portions.

Figure 6A:
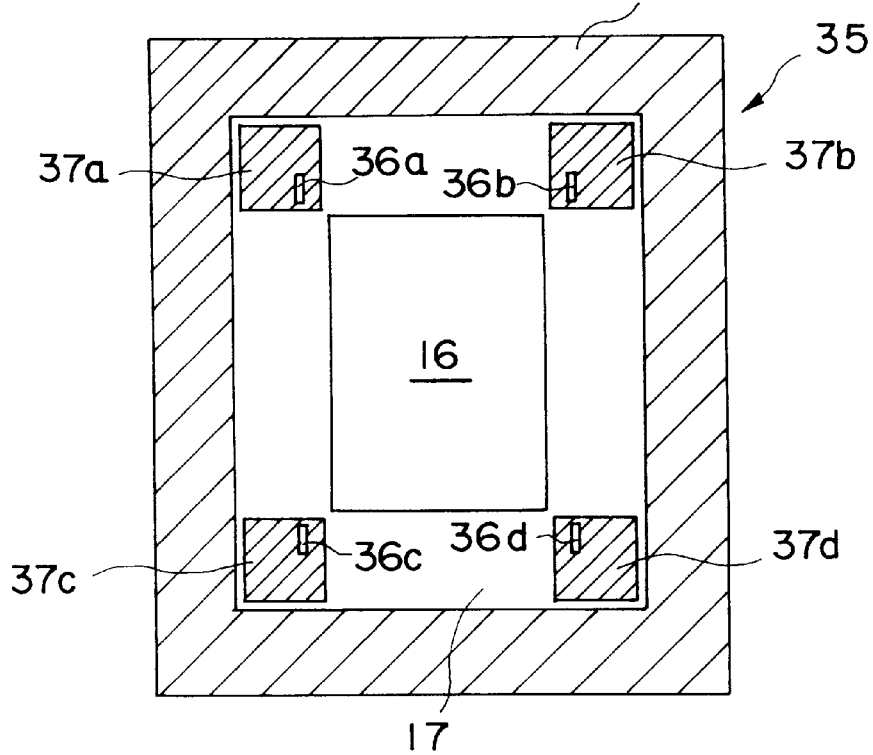
FIG. 6A is a plan view showing the third reticle employed in the present invention.

FIG. 6A shows pattern shapes of the reticle 35.

Except for inspection patterns 36a to 36d and masking patterns 37a to 37d, the configurations of the third embodiment are the same as those of the first and second embodiments. The same references as those used in FIG. 4 denote the same elements shown therein.

In FIG. 6A, in the dicing line areas 17, inspection pattern forming areas are disposed in the diagonal direction of the square LSI pattern. The inspection pattern forming areas are covered by the masking patterns 37a to 37d.

If the masking patterns 37a to 37d are partitioned into four sections by virtual lines in the dicing direction, the inspection patterns 36a to 36d are opened at the portions nearest to the LSI pattern 16. The inspection patterns 36a to 36d have the same shape, and sizes and shapes thereof have a dependency on focus.

By use of the masking patterns 37a to 37d, either inspection patterns already exposed on the resist can be prevented from being eliminated by the second exposure process, or the area where the inspection patterns will be next formed can be prevented from being irradiated by the unnecessary exposure light.

Figure 6B:
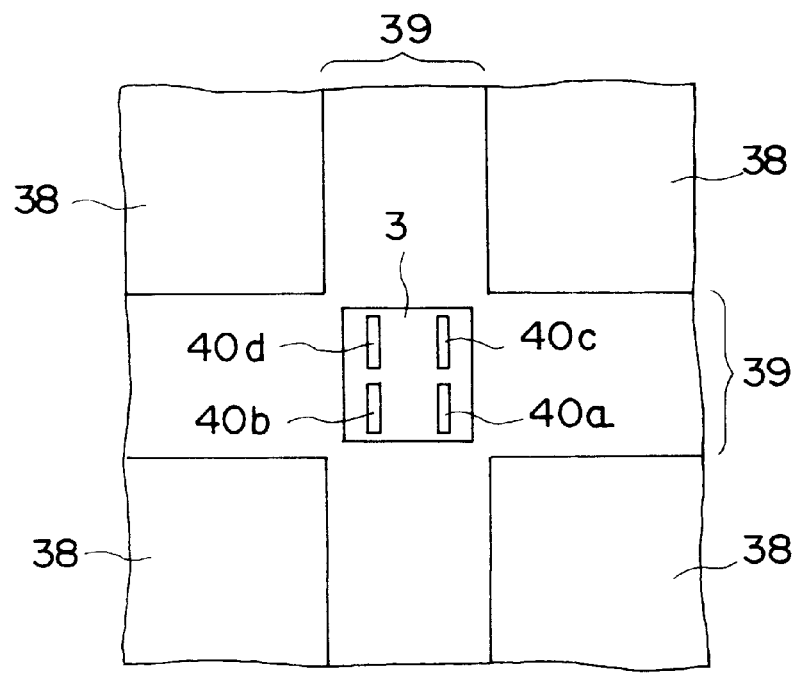
FIG. 6B is an enlarged plan view showing transferred patterns of the third reticle on the resist.

When the resist 3 on the wafer 2 is exposed by using such reticle 35 and then developed, the LSI patterns 40 are formed on the resist 3, thus sandwiching the dicing line area 39 in a matrix fashion, as shown in FIG. 6B. The square resist 3 remains in the center of the intersecting area of the dicing line area 39. Four inspection patterns 40a to 40d are formed as openings in the intersecting areas of the dicing line areas 39.

Four inspection patterns 40a to 40d formed in the intersecting areas of the dicing line areas 39 on the wafer 2 are within the field of view of the microscope, so that their differences can be distinguished from each other at once. In case the inspection patterns 40a to 40d have differences in shape, it can be found that the level adjustment is not properly effected since the wafer is inclined.

According to this third embodiment, the pattern of the resist 3 formed in the intersecting area of the dicing line area 39 on the wafer 2 is a rectangular shape having a side of 100 μm, for example. The minute inspection patterns 40a to 40d are formed as aperture patterns. Accordingly, these inspection patterns 40a to 40d are scarcely eliminated and removed by a later etching step.

On the contrary, since the inspection patterns 21a to 21d and 31a to 31d shown in the first and second embodiments are formed by the resist 3 and are minute, there is the possibility that the inspection patterns are peeled off. If the peeled inspection patterns 21a to 21d and 31a to 31d are attached on the LSI patterns 22 and 30, defects are caused in the later formed patterns. This makes a yield of the exposure lower.

(Fourth Embodiment)

In FIGS. 4A and 6B showing the above three embodiments, linear inspection patterns have been illustrated. But, as other inspection patterns, wave-shape inspection patterns are not restricted to particular shapes.

Figure 7:
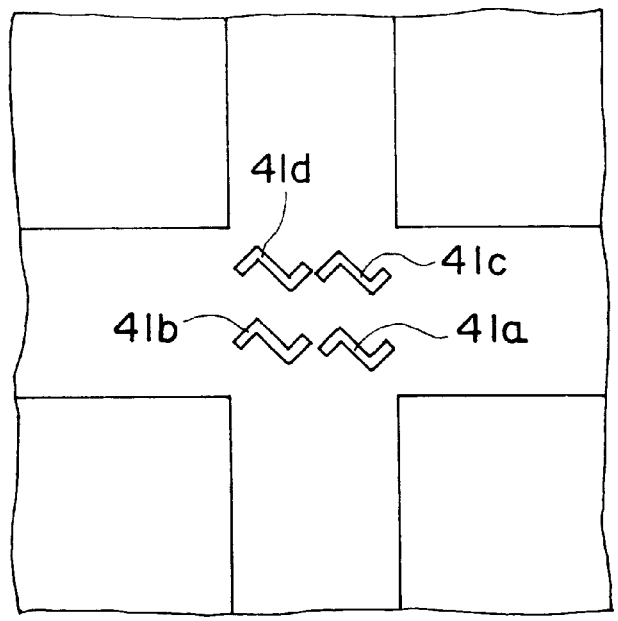
FIG. 7 is an enlarged plan view showing the first embodiment after inspection patterns of the fourth reticle employed in the present invention are transferred.
Figure 8:
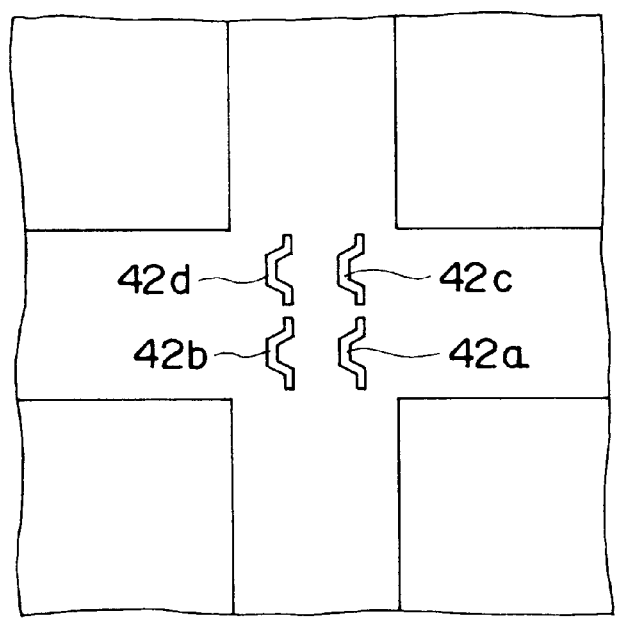
FIG. 8 is an enlarged plan view showing the second embodiment after inspection patterns of the fourth reticle employed in the present invention are transferred.

Inspection patterns 41 in FIG. 7 have pattern shapes which are used to form active regions divided by a field oxide film in the LSI. Inspection patterns 42 in FIG. 8 have the same pattern shapes as those of gate electrodes of transistors.

Since various patterns other than those are formed in LSI manufacturing steps, it is desirable that inspection patterns having shapes suitable for the exposure process are formed in the intersecting areas of the dicing line areas.

As shown in FIGS. 9A to 9D, for example, different shapes and locations of the inspection patterns may be employed in every reticle. In these FIGS. 9A to 9D, inspection pattern forming areas 45 to 48 are provided in the same locations near four corners of LSI patterns 44a to 44d of four reticles 43a to 43d. Each of the inspection pattern forming areas 45 to 48 is divided into four sections, i.e., upper left, lower left, upper right and lower right sections, in the dicing direction.

Figure 9A:
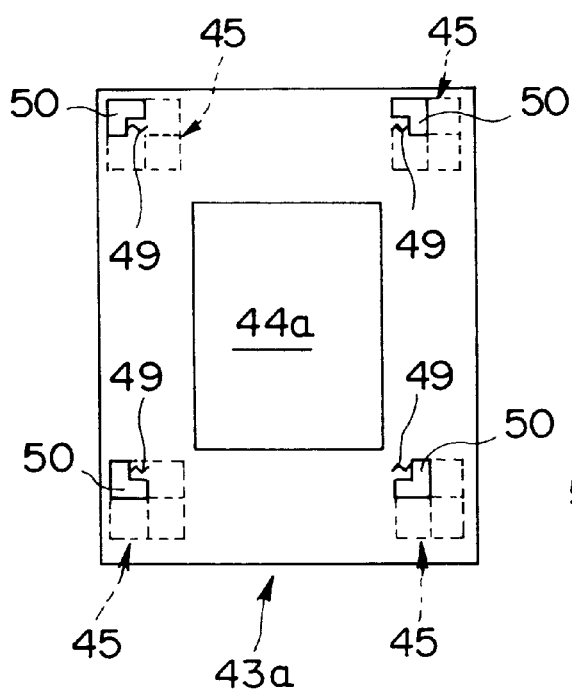
FIGS. 9A to 9D are plan views each showing a reticle employed in the present invention.
Figure 9B:
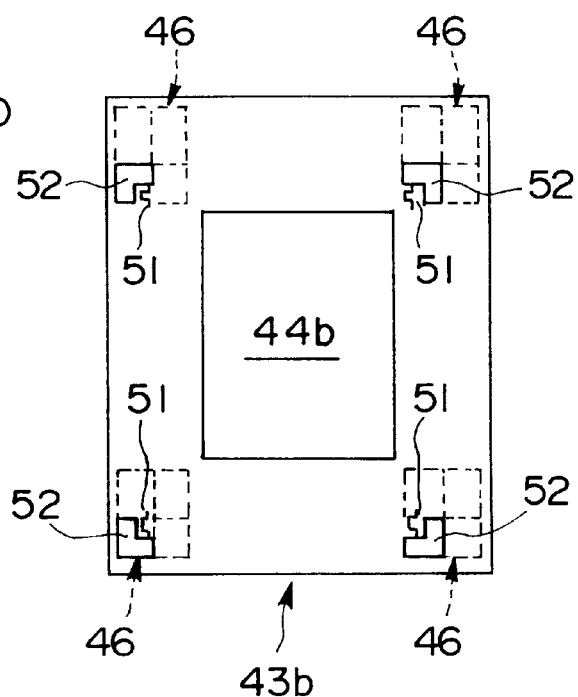

As shown in FIG. 9A, the inspection patterns 49 of the first reticle 43a are formed so as to have the same wave-shapes as those of the active regions in the semiconductor integrated circuit. The inspection patterns 49 are located in the upper left section of the inspection pattern forming areas 45. In particular, the inspection patterns 49 are formed in the areas nearest to the LSI pattern 44a of the upper left sections. Masking patterns 50 are formed in the remaining areas of the upper left sections. As shown in FIG. 9B, the inspection patterns 51 of the second reticle 43b are formed so as to have the same shape as those of the gate electrodes of the transistors. The inspection patterns 51 are located in the lower left section of the inspection pattern forming areas 46. More particularly, the inspection patterns 51 are formed in the area nearest to the LSI pattern 44b of the lower left section, and masking patterns 52 are formed in the remaining areas of the lower left sections.

Figure 9C:
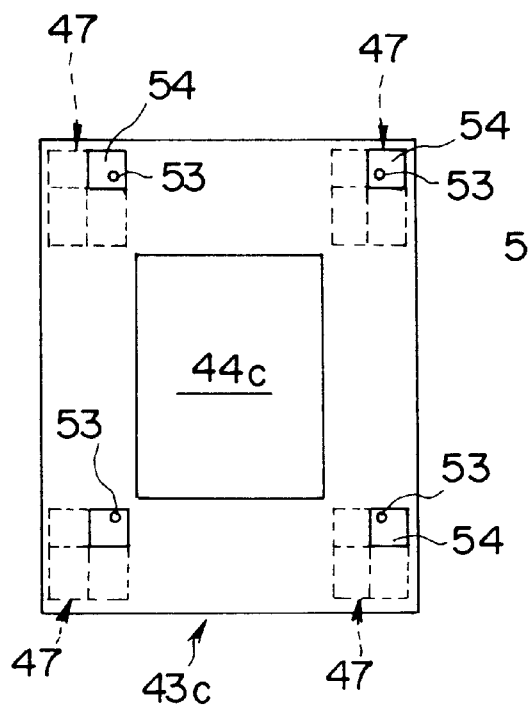

As shown in FIG. 9C, the inspection patterns 53 of the third reticle 43c are formed so as to have the same shapes as those of the via holes in the semiconductor integrated circuit. More particularly, the inspection patterns 53 are formed as openings in the area nearest to the LSI patterns 44c of the masking patterns 54, which cover the upper right section of the inspection pattern forming areas 47.

Figure 9D:
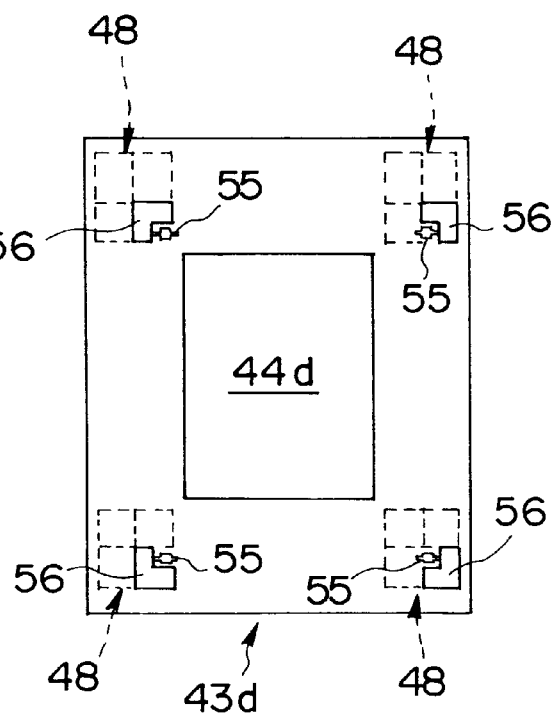

As shown in FIG. 9D, the inspection patterns 55 of the fourth reticle 43d are formed so as to have the same shape as those of part of the interconnections in the semiconductor integrated circuit. The inspection patterns 55 are located in the lower right section of the inspection pattern forming areas 48. Particularly, the inspection patterns 55 are formed in the area nearest to the LSI patterns 44d of the lower right section. Masking patterns 56 are formed in the remaining areas of the lower right sections.

Figure 10:
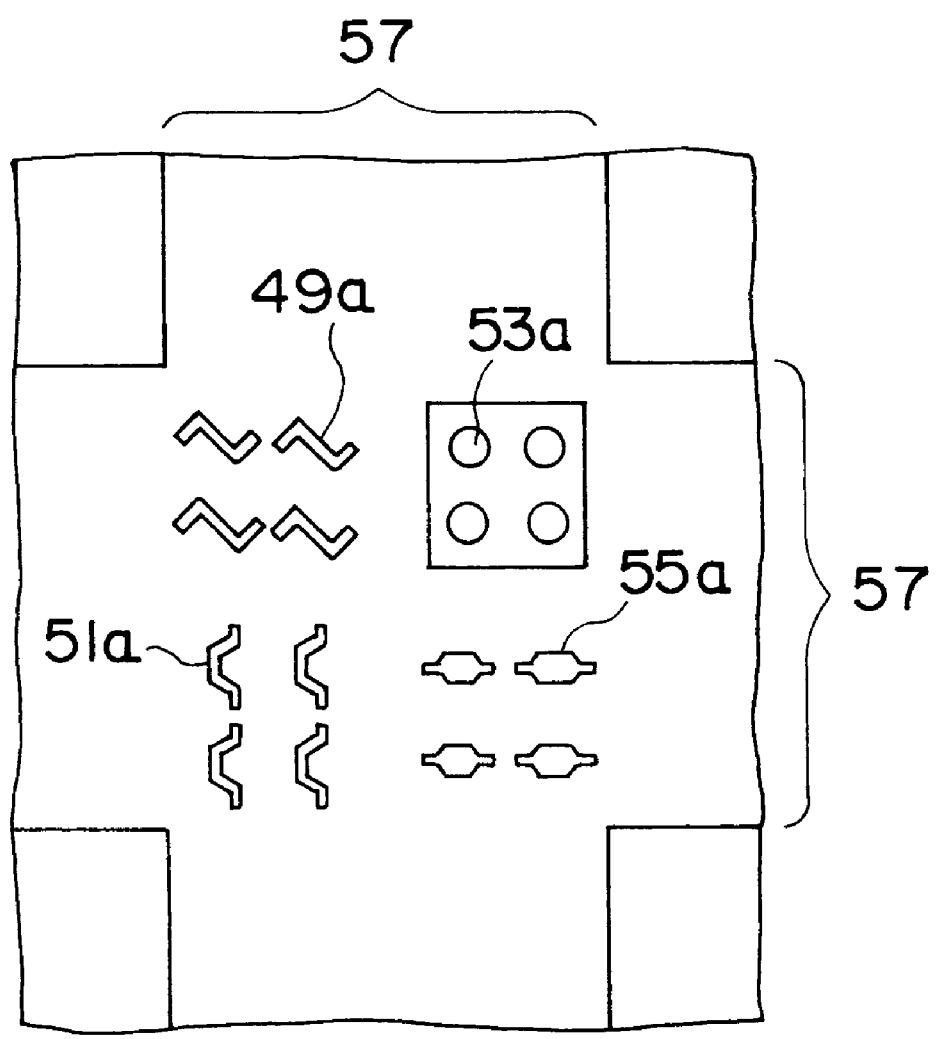
FIG. 10 is an enlarged plan view showing a situation obtained after inspection patterns of the reticles in FIGS. 9A to 9D are transferred on the resist.

LSI manufacturing processes are ordinarily effected by repeating steps of exposing the resist 3 formed on the surface of the wafer 2 by use of the above four reticles 43a to 43d, developing the resist 3, etching the ground film, removing the resist 3, and forming the film made of any one of conductor, semiconductor and insulator. Thus, as shown in FIG. 10, four kinds of inspection patterns 49a, 51a, 53a, 55a formed of the conductor film, the insulator film and the resist, four inspection patterns being included in respective kind, are formed in the intersecting areas of the dicing line areas 57 on the wafer 2.

As has been described above, a plurality of inspection patterns 49a, 51a, 53a, 55a having different shapes are formed separately in the dicing line areas by plural steps. For this reason, by comparing the same kind of inspection patterns with each other, it can be checked by using differences in shape thereof whether there is a deviation in focus or not. Further, it becomes possible to check changes of deviation in focus of different kinds of the inspection patterns.

Accordingly, by watching the inspection patterns 49a, 51a, 53a and 55a, not only it can be determined whether the amount of slant of the stage is allowable or not, but also it can be determined in a short time which process causes such slant when the wafer 2 becomes inclined and thus the level adjustment becomes improper in the course of manufacturing steps of the semiconductor device.

In this case, since four kinds of inspection patterns 49a, 51a, 53a, 55a exist in the intersecting areas of the dicing line areas 57, differences of deviation in focus therebetween can be watched at once within the field of view of the microscope. In view of the width of the dicing line area, the area where the same kinds of inspection patterns are gathered on the wafer 2 is formed as a rectangular area having a side of 33 $\mu$m, for example.

(Fifth Embodiment)

In the above embodiments, a shape of the inspection patterns is formed as an I-shape, a wave-shape etc. However, it has been found by the inventor's experience that a rhombus has large dependency on focus in the inspection patterns.

Figure 11A:
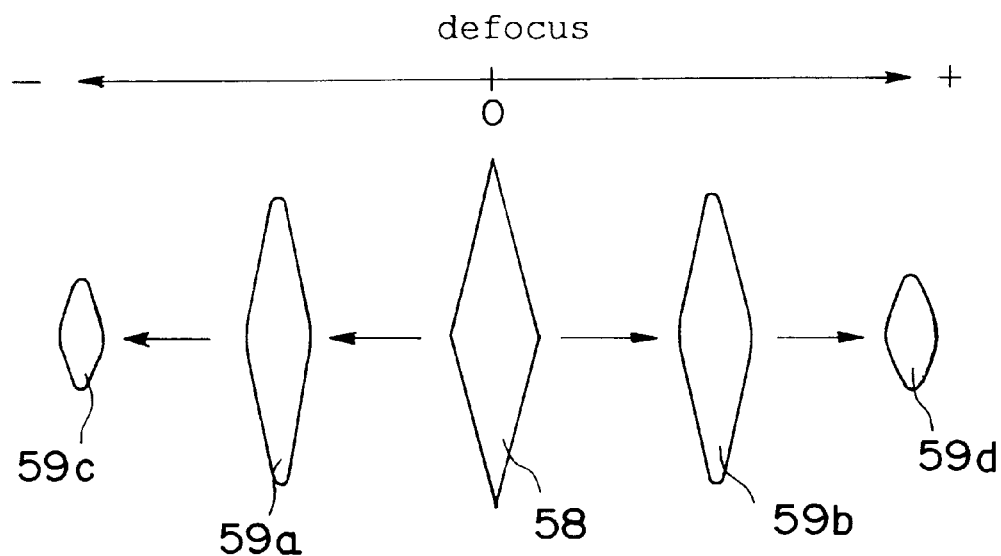
FIG. 11A is a plan view showing a transferred situation when the inspection pattern of the reticle in the embodiment of the present invention is formed as a rhombus.

FIG. 11A shows an amount of deviation in focus when the inspection patterns of the reticles are formed as the rhombus and then they are exposed on the resist formed on the wafer and are developed. That is, as shown in the middle of FIG. 11A, if the resist patterns 58 having not-deformed rhombus patterns are formed, the exposure light is focused on the resist. In case the focal point is deviated in the (+) direction or the (−) direction, corners of the rhombus of the resist patterns 59a to 59d on the wafer are rounded off as the deviation becomes large in either case. Therefore, the patterns become gradually small.

Consequently, a focusing level may be easily determined.

Figure 11B:
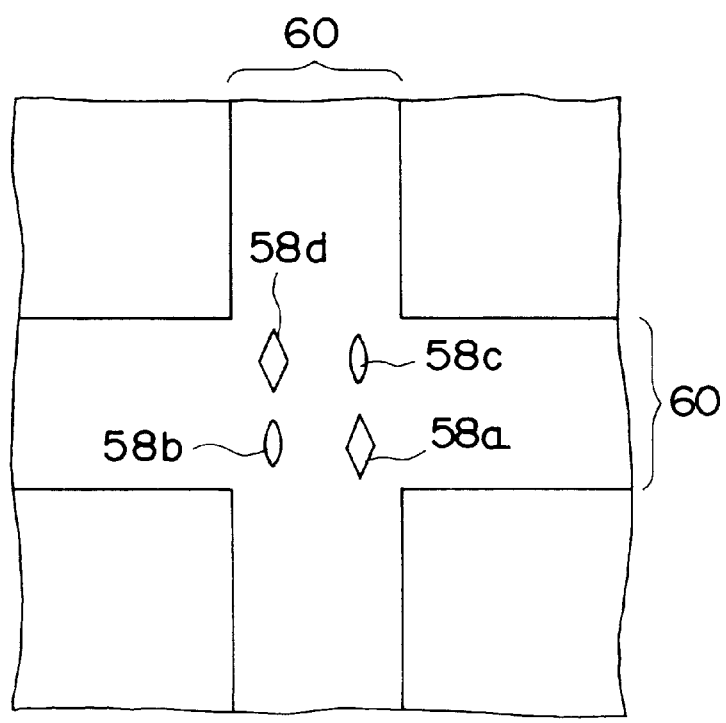
FIG. 11B is an enlarged plan view showing a situation obtained after the rhombus inspection patterns of the reticles in FIG. 11A are transferred on the resist.

For example, as shown in FIG. 11B, the inspection patterns 58a, 58d positioned in one diagonal direction hold rhombus shapes in the intersecting areas of the dicing line areas 60 whereas the inspection patterns 58b, 58c positioned in the other diagonal direction become substantial ellipse shapes, thus resulting in deformed shapes. Therefore, it can be found that the wafer is inclined in the direction extending from the center of the LSI pattern to the deformed inspection patterns 58b and 58c.

Figure 12A:
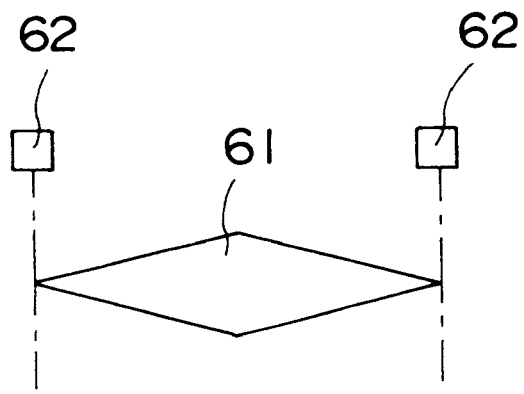
FIG. 12A is a plan view showing the inspection pattern and subsidiary patterns as a standard of measurement degree of the reticle in the embodiment of the present invention.
Figure 12B:
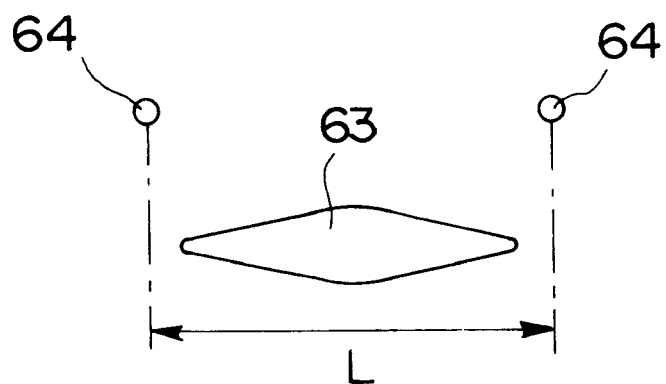
FIG. 12B is a plan view showing a situation obtained after the inspection patterns and the subsidiary patterns of the reticle in FIG. 12A are transferred on the resist.

In addition, as shown in FIG. 12A, note that two rectangular subsidiary patterns 62 may be formed in the sides of the rhombus-shaped inspection patterns 61 formed in the reticle and that these subsidiary patterns 62 may be used as a length scale in the longitudinal direction of the inspection patterns 61. As shown in FIG. 12B, if the resist is exposed using the reticle, a distance L between two centers of the subsidiary patterns 64 on the resist is not varied even though the subsidiary patterns 63 formed on the resist are deformed because of the deviation in focus upon exposing the resist. On the contrary, a length in the major axis direction of the rhombus-shaped inspection patterns 63 formed on the resist becomes short as the deviation in focus is increased.

Accordingly, an extent of degradation of the rhombus-shaped inspection patterns 64 can be readily decided by using two subsidiary patterns 64 as an absolute scale.

(Sixth Embodiment)

Figure 13A:
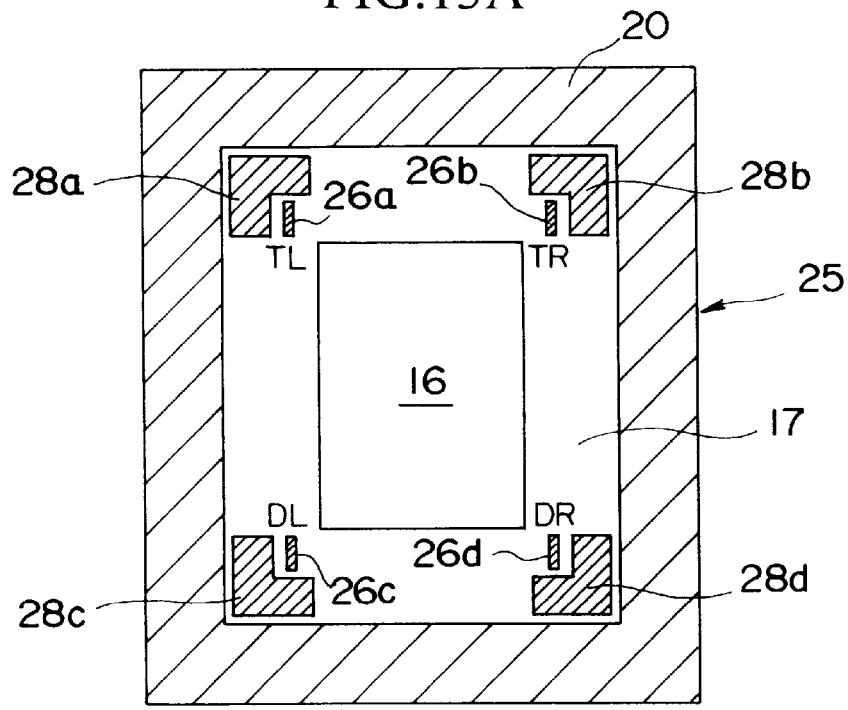
FIG. 13A is a plan view showing the sixth reticle employed in the present invention.

As shown in FIG. 13A, in the sixth embodiment, identification symbol patterns TL, TR, DL, DR, each having a different shape, are formed near each of the inspection patterns 28a to 28d of the reticle exemplified in the second embodiment.

Figure 13B:
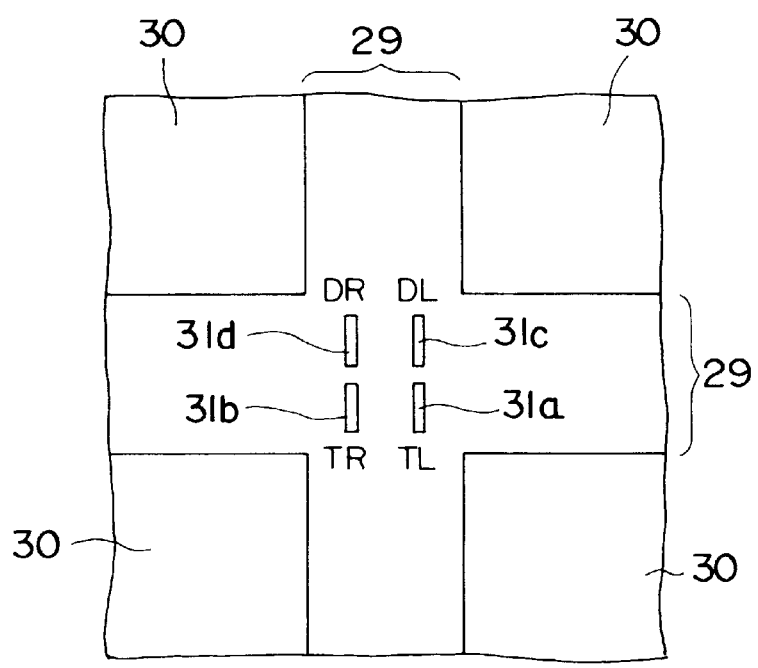
FIG. 13B is an enlarged plan view showing transferred patterns of the sixth reticle on the resist.

As a result, as shown in FIG. 13B, the identification symbol patterns TL, TR, DL, DR are attached to the inspection patterns 31a to 31d formed on the wafer one by one. Thus, correspondences between the inspection patterns 31a to 31d formed on the wafer and the inspection patterns 28a to 28d of the reticle may be identified easily.

In FIGS. 13A and 13B, the same references as those used in FIGS. 5A and 5B denote the same constituent elements.

(Seventh Embodiment)

In the first to third embodiments above, it is a little hard to correspond the locations between the inspection patterns of the reticle around the LSI patterns and the inspection patterns in the intersecting areas of the dicing line areas on the wafer.

Figure 14A:
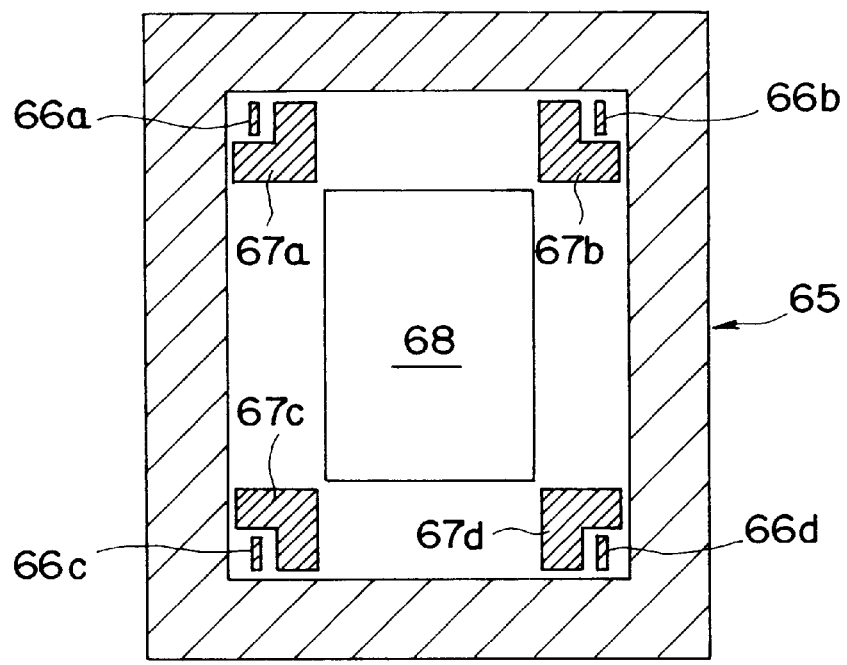
FIG. 14A is a plan view showing the seventh reticle employed in the present invention.
Figure 14B:
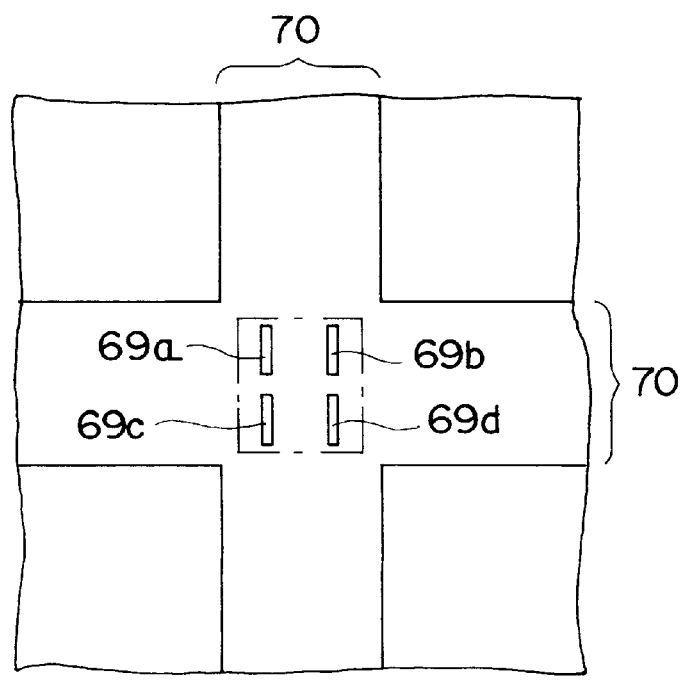
FIG. 14B is an enlarged plan view showing transferred patterns of the seventh reticle on the resist.

Therefore, as shown in FIG. 14A, in order to set configurations of the inspection patterns 66a to 66d of the reticle 65 and configurations of the masking patterns 67a to 67d differently from those in the second embodiment, the masking patterns 67a to 67d are formed in the areas near to the LSI pattern 68 in the inspection pattern forming area, and the inspection patterns 66a to 66d are arranged in the other side. Thereby, as shown in FIG. 14B, since both the arrangement of the inspection patterns 69a to 69d on the wafer and the arrangement of the inspection patterns 66a to 66d of the reticle (locations of the corners of the LSI pattern 68) become similar, they can be easily identified. Thus, the identification symbol patterns shown in the sixth embodiment are not required to be formed.

(Eighth Embodiment)

In the above embodiments, the inspection patterns are composed of one united pattern. In addition, note that the inspection patterns may be formed by two patterns or more having a slight clearance therebetween.

For example, two I-shaped patterns may be aligned at a distance, or a plurality of line and space patterns may be formed, or rectangular patterns may be arranged at a distance in vertical and horizontal directions.

Figure 15:
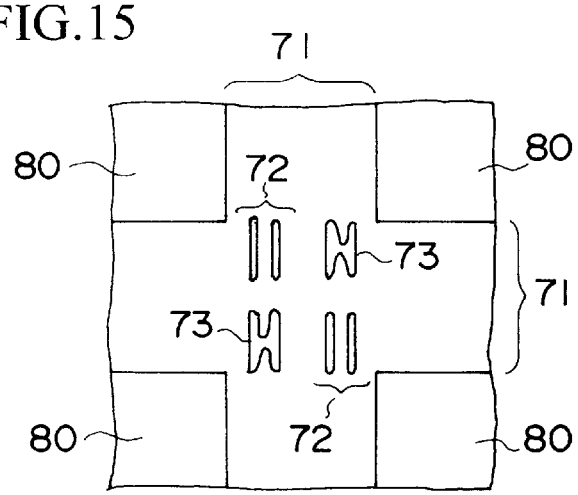
FIG. 15 is a plan view showing the first transferred situation on the resist when the inspection patterns of the reticle employed in the present invention are formed by using two patterns or more.

As shown in FIG. 15, assume that an inspection pattern of the reticle is formed by aligning two I-shaped patterns at a distance, II-shaped patterns 72 are formed in the intersecting areas of the dicing line areas 71 on the wafer if the exposure light is focused on the wafer. On the other hand, H-shaped patterns 73 are formed if the exposure light is out of focus. Thereby, it becomes easy to determine whether the level adjustment of the reticle is proper or not.

Figure 16:
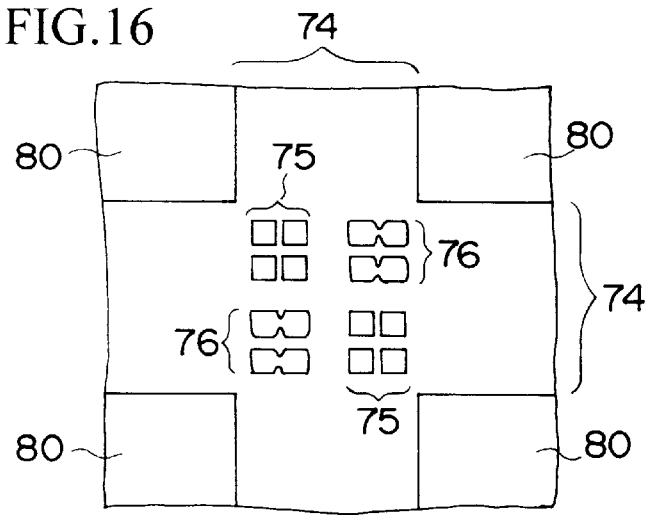
FIG. 16 is a plan view showing the second transferred situation on the resist when the inspection patterns of the reticle employed in the present invention are formed by using two patterns or more.

Further, as shown in FIG. 16, assume that an inspection pattern of the reticle is formed by arranging rectangular patterns in a matrix fashion at a distance, rectangular patterns in the inspection patterns 75 are separated from each other in the intersecting areas of the dicing line areas 74 on the wafer if the exposure light is focused on the wafer. On the other hand, if the exposure light is out of focus, it can be determined readily whether the shape of the inspection pattern is proper or not since rectangular patterns in an inspection pattern 73 are coupled to each other. The rectangular pattern may be employed as, for example, a shape of a capacitor electrode used in the DRAM.

In FIGS. 15 and 16, a reference 80 denotes an LSI pattern.

(Ninth Embodiment)

Figure 17:
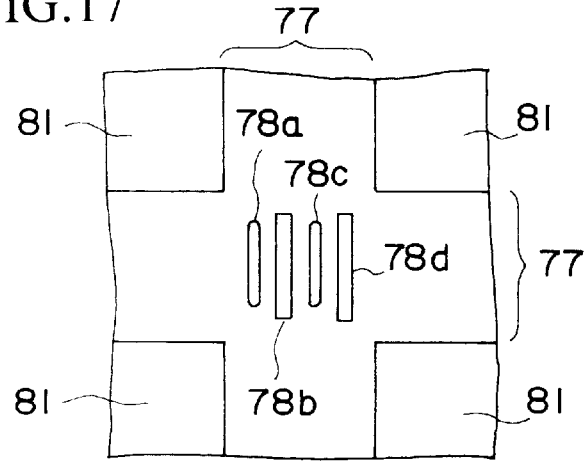
FIG. 17 is a plan view showing the transferred situation on the resist when the inspection patterns of the reticle employed in the present invention are disposed in parallel.

In the above embodiments, a plurality of the inspection patterns are arranged in longitudinal and lateral directions in a matrix fashion in the intersecting areas of the dicing line areas of the wafer. However, note that, as shown in FIG. 17, four inspection patterns 78a to 78d may be disposed in parallel in the intersecting areas of the dicing line areas 77. According to this pattern configuration, relative differences in length, width etc. can be readily discriminated from each other.

In FIG. 17, a reference 81 denotes an LSI pattern.

What is claimed is:

1. A method of manufacturing a semiconductor device, said method comprising the steps of:
   (a) forming a photosensitive film on a substrate;
   (b) providing a reticle which has dicing line patterns, a rectangular main area surrounded by said dicing line patterns, focus deviation inspection patterns formed in said dicing line patterns on the peripheries of respective corners of said rectangular main area, and masking patterns which are made of light shielding material, each masking pattern of said masking patterns being formed in said dicing line pattern adjacent to each focus deviation inspection pattern of said focus deviation inspection patterns;
   (c) positioning said reticle over said photosensitive film;
   (d) exposing said photosensitive film to transfer said patterns on said reticle to said photosensitive film;
   (e) stepping said reticle in a next exposure position on said photosensitive film, where at least two focus deviation inspection patterns on said reticle are overlapped with at least two of said transferred masking patterns, respectively;
   (f) exposing said photosensitive film to transfer said patterns on said reticle to said photosensitive film so that said focus deviation inspection patterns at the two corners of the rectangular main area on said reticle is transferred in an area corresponding to said masking patterns produced in the corners of a previous exposure corresponding to the side of the rectangular main area of the reticle opposite the side of the rectangular main area of the focus deviation patterns being transferred patterns;
   (g) repeating said steps of (e) and (f), for the remaining portions of the photosensitive film;
   (h) developing said photosensitive film; and
   (i) observing shapes of said transferred focus deviation inspection patterns and comparing an extent of change in said shapes with each other to inspect whether deviation in focus is present or not and a magnitude of deviation in focus between adjacent exposures.

2. A method according to claim 1, wherein said transferred area of said focus deviation inspection patterns is an intersecting area of said transferred dicing line patterns.

3. A method according to claim 1, wherein said transferred area of said focus deviation inspection patterns is a neighbor area of an intersecting area of said transferred dicing line patterns.

4. A method according to claim 1, wherein arrangement of said transferred focus deviation inspection patterns which belong to said differently transferred patterns on said reticle and close on the periphery of said corner corresponds to arrangement of said focus deviation inspection patterns on said reticle.

5. A method according to claim 1, wherein said transferred focus deviation inspection patterns on the periphery of said corner are disposed in longitudinal and lateral directions.

6. A method according to claim 1, wherein said transferred focus deviation inspection patterns on the periphery of said corner area are disposed in parallel.

7. A method according to claim 1, wherein each of said focus deviation inspection patterns is formed on said reticle as a rhombus shape or a rectangle shape.

8. A method according to claim 1, further comprising patterns of semiconductor integrated circuits which include transistors, being formed in said main area on said reticle, wherein said focus deviation inspection patterns on said reticle are the same shapes as one or more kinds of said patterns of said semiconductor integrated circuits.

9. A method according to claim 8, wherein said patterns of semiconductor integrated circuits are selected from the group consisting of patterns of active regions surrounded by a field insulating film, patterns of gate electrodes, patterns of openings, and patterns of interconnections.

10. A method according to claim 1, wherein a plurality of patterning steps are provided, and said focus deviation inspection patterns on said respective reticles used in respective patterning steps are disposed not to be overlapped with each other when said reticles are superposed so that said respective main areas thereon are consistently superposed.

11. A method according to claim 1, further comprising a plurality of subsidiary patterns formed near said focus deviation inspection pattern on said reticle so that an amount of change in shape of said transferred focus deviation inspection pattern due to deviation in focus can be read based on forming locations of said subsidiary patterns.

12. A method according to claim 11, wherein each of said focus deviation inspection patterns is formed on said reticle as a rhombus shape.

13. A method according to claim 11, wherein said subsidiary patterns are disposed at locations corresponding to both ends of said focus deviation inspection pattern on said reticle.

14. A method according to claim 11, wherein each of said subsidiary patterns is formed on said reticle as a rectangular shape.

15. A method according to claim 10, wherein each of said subsidiary patterns is formed on said reticle as a circular shape.

16. A method according to claim 1, further comprising a plurality of identification marks capable of identifying respective locations of said focus deviation inspection patterns on said reticle, and said respective identification marks being formed near said focus deviation inspection patterns on said respective peripheries of said corners on said reticle.

17. A method according to claim 16, wherein each of said identification marks is formed as a character symbol representing its location on said reticle.

18. A method according to claim 1, wherein said focus deviation inspection pattern disposed on the periphery of said each corner on said reticle is composed of a pattern or a combination of a plurality of patterns formed spaced apart each other.

19. A method according to claim 18, wherein said plurality of patterns formed spaced apart each other on said reticle are identical in shape and size.

* * * * *